(12) United States Patent
Gaggl et al.

(10) Patent No.: US 7,333,041 B2
(45) Date of Patent: Feb. 19, 2008

(54) SYSTEM FOR ANALOG-TO-DIGITAL CONVERSION

(75) Inventors: Richard Gaggl, Pörtschach (AT); Dietmar Straussnigg, Villach (AT); Andreas Wiesbauer, Pörtschach (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/471,458

(22) Filed: Jun. 20, 2006

(65) Prior Publication Data

US 2007/0013570 A1    Jan. 18, 2007

(30) Foreign Application Priority Data

Jun. 21, 2005    (DE) ............ 10 2005 028 726

(51) Int. Cl.
*H03M 3/00* (2006.01)

(52) U.S. Cl. ........................... 341/143

(58) Field of Classification Search ......... 341/143, 341/155, 200

See application file for complete search history.

(56) References Cited

U.S. PATENT DOCUMENTS

| | | | | |
|---|---|---|---|---|
| 5,936,562 | A * | 8/1999 | Brooks et al. | 341/143 |
| 7,129,866 | B2 * | 10/2006 | Bjornsen | 341/118 |
| 7,176,819 | B1 * | 2/2007 | Swerlein et al. | 341/143 |

FOREIGN PATENT DOCUMENTS

WO    WO 00/08765    2/2000

\* cited by examiner

*Primary Examiner*—Brian Young
(74) *Attorney, Agent, or Firm*—Brinks Hofer Gilson & Lione

(57) ABSTRACT

An analog-to-digital converter system converts an analog input signal into a digital output signal. The analog input signal is converted into a first digital signal by a fed back analog-to-digital conversion. A second digital signal is additionally formed, depending on the analog input signal or on the digital output signal, which, combined with the first digital signal, results in the digital output signal.

43 Claims, 6 Drawing Sheets

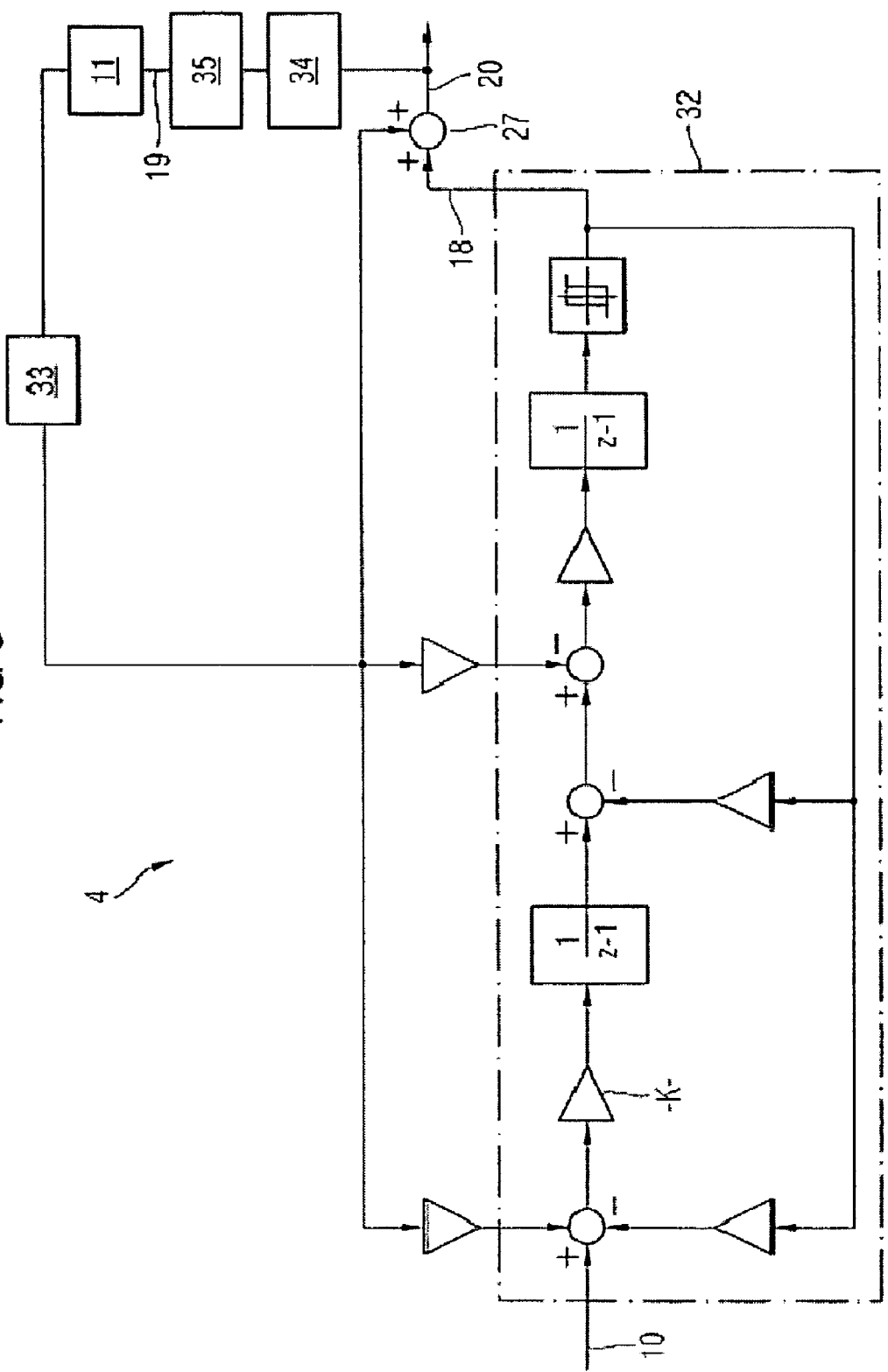

SYSTEM FOR ANALOG-TO-DIGITAL CONVERSION

PRIORITY CLAIM

This application claims the benefit of priority from German Patent Application No. DE 10 2005 028 726.3, filed Jun. 21, 2005, which is incorporated by reference herein.

BACKGROUND

1. Technical Field

The present invention relates to analog-digital conversion, and particularly to analog-to-digital conversion by which a conventional oversampled, fed back analog-to-digital conversion (e.g. a sigma-delta conversion) is improved.

2. Background Information

In conventional single-bit sigma-delta analog-to-digital converters (hereinafter also designated as single-bit sigma-delta converters), if there is too high a drive inside the analog-to-digital converter, impermissibly high signal levels occur, leading to overdrive of an amplifier used inside the analog-to-digital converter, so the input signal has to be restricted. The input signal is in this case typically restricted by −3 dBFS.

As a single-bit sigma-delta converter has as substantial advantages a linear single-bit digital-to-analog conversion and a surface area requirement which is small compared to other converters, if it is configured as a semi-conductor circuit, the disadvantageous restriction or attenuating of the input signal mentioned above is allowed for in current applications. A substantial disadvantage of this restriction is that a maximum permissible input signal must be below a possible value of a provided reference voltage for a required signal-to-noise ratio. An allowed noise power within a useful frequency band of the input signal therefore has to be correspondingly reduced for the required signal-to-noise ratio. In implementation of a single-bit sigma-delta converter this has to be dearly paid for, as a reduction in the noise power by 3 dB means that a capacity surface inside a corresponding semi-conductor circuit has to be doubled in order to reduce the dominant kT/C noise in a solution. An increased capacity surface or an increased capacity value is also here disadvantageously reflected in an increased current requirement of the corresponding semi-conductor circuit.

Therefore, a need exists in the art for a method and a device for analog-to-digital conversion, wherein there is no need to restrict the input signal.

BRIEF SUMMARY

An analog-to-digital converter system converts an analog input signal into a digital output signal. The analog input signal is converted into a first digital signal by a fed back analog-to-digital conversion. A second digital signal is additionally formed, depending on the analog input signal or on the digital output signal, which, combined with the first digital signal, results in the digital output signal.

A device for analog-to-digital conversion includes a fed back analog-to-digital converter, wherein the device is operable to convert an analog input signal into a digital output signal. The fed back analog-to-digital converter converts the analog input signal of the device into a first digital signal, and the device includes a combination unit that combines the first digital signal and a second digital signal to generate the digital output signal. The device forms the second digital signal based on the analog input signal.

Other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The invention can be better understood with reference to the following drawings and description. The components in the figures are not necessarily to scale, emphasis instead being placed upon illustrating the principles of the invention. Moreover, in the figures, like referenced numerals designate corresponding parts throughout the different views.

FIG. 6 illustrates an example digital signal feedback system with a single-bit sigma-delta converter.

DETAILED DESCRIPTION

Figure 1:
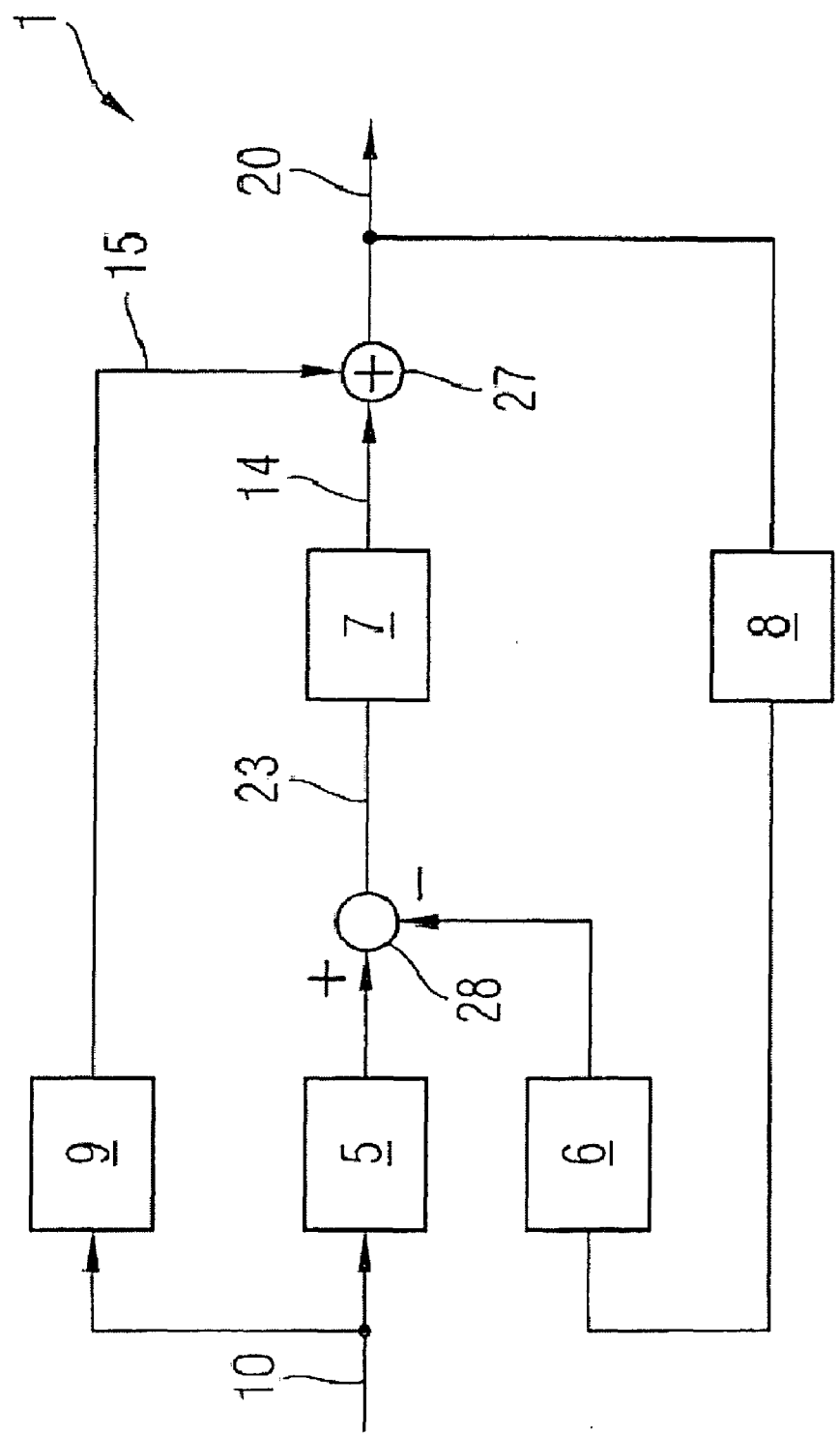
FIG. 1 illustrates a first example analog-to-digital converter, wherein a digital output signal is fed back.

FIG. 1 illustrates a device 1 for analog-to-digital conversion that manages without disadvantageous restriction of an analog input signal 10 of the device 1 to generate a digital output signal 20 of the device 1. The analog input signal 10 is in this case filtered through an analog low-pass filter 5. Then a difference is formed in a subtractor 28 from the filtered input signal 10 and the analog-converted digital output signal 20, giving rise to an analog signal 23. This analog signal 23 is converted into a first digital signal 14 by a quantizer 7. A feedback of the digital output signal 20 is formed by a 2-bit digital-to-analog converter 8 and an analog control filter 6, connected thereto. The quantizer 7, the 2-bit digital-to-analog converter 8, the analog control filter 6 and the subtractor 28 therefore form a fed back analog-to-digital converter, which in this illustrated embodiment operates with oversampling, so this analog-to-digital converter can also be designated as a single-bit sigma-delta analog-to-digital converter. The transmission function of this fed back analog-to-digital converter is largely determined by the control filter 6.

Oversampling is understood as sampling at a sampling rate which is more than double the highest frequency within the analog input signal, if it is fed, e.g. to the sigma-delta converter, wherein at this time it is low-pass filtered. The sampling rate during oversampling is therefore above a sampling rate preset by the sampling theorem.

To enable a higher drive of the analog input signal 10, the analog input signal 10 is converted by a 3-value comparator 9 into a second digital signal 15, which, together with the first digital signal 14, in an addition element 27 results in the digital output signal 20. As the single-bit sigma-delta analog-to-digital converter has a control circuit to suppress interference, owing to the feedback of the digital output signal 20, the second digital signal 15, which can also be interpreted as an "interfering signal", is regulated by this control circuit, advantageously resulting in a reduction in the signal level of the analog signal 23 at the input of the quantizer 7.

The 3-value comparator 9 operates as follows. If the analog input signal 10 is above a first threshold value, the 3-value comparator 9 generates a digital value +1, if the analog input signal 10 is below a second threshold value the 3-value comparator 9 generates a digital value −1 and if the analog input signal 10 is between the first and the second threshold values, the 3-value comparator 9 generates a digital value 0. The first and the second threshold values are in this case equal in amount and the first threshold value is greater than the second threshold value. The threshold values are chosen depending on the drive area of the single-bit sigma-delta analog-to-digital converter used.

With the method, a higher drive of the analog input signal than conventional methods is possible, as the second digital signal, which is generated as a function of the analog input signal, can be interpreted as a kind of interfering signal which is regulated by the fed back analog-to-digital conversion, which, due to the feedback, has a control circuit.

For this, the second digital signal is formed from the analog input signal, in particular, by the comparator. The second digital signal is therefore dependent on a level of the analog input signal and advantageously feeds in an interfering signal only if the level of the analog input signal is outside the first and the second threshold values. The second digital signal adopts a value different from 0 only if the level or the drive of the analog signal is too large, as only in this case does the analog input signal have to be correspondingly regulated before the analog-to-digital conversion.

Figure 2:
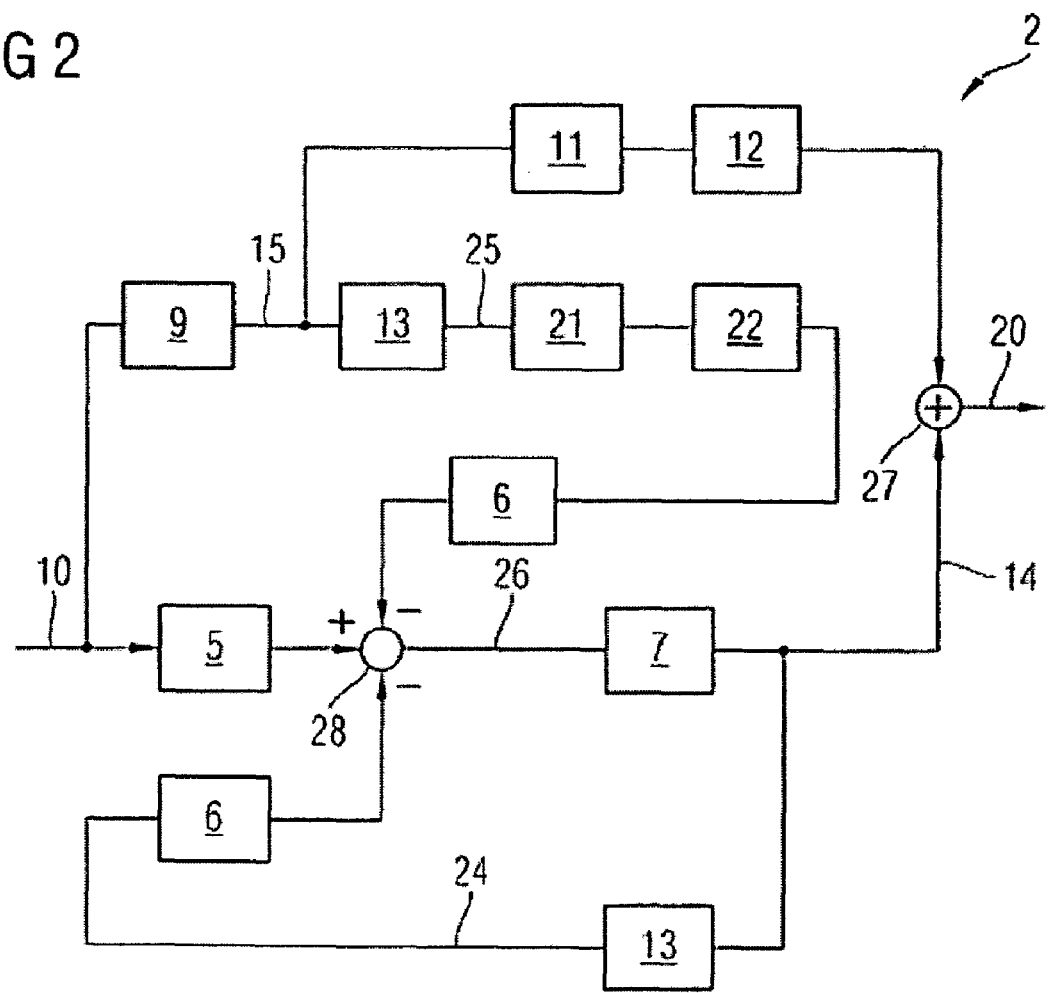
FIG. 2 illustrates a second example analog-to-digital converter, wherein, instead of the digital output signal, two components from which the digital output signal is formed are fed back separately.

In FIG. 2 a second embodiment is illustrated. Elements in FIG. 2 which have the same function as in FIG. 1 are designated by the same reference numeral and not explained again below. By contrast to the embodiment illustrated in FIG. 1, in a device 2 illustrated in FIG. 2 it is not the analog-converted digital output signal 20 which is fed back, but a sum of the first analog-converted digital signal 14 and the second analog-converted digital signal 15 is subtracted from the filtered analog input signal 10, which, though, in principle corresponds to a feedback of the analog-converted digital output signal 20, composed of the first digital signal 14 and the second digital signal 15. In the second embodiment, instead of the digital output signal 20, both its components, namely the first digital signal 14 and the second digital signal 15, of which it is composed, are fed back individually or subtracted from the analog input signal 10.

For this, both the first digital signal 14 is converted in a 1-bit digital-to-analog converter 13 into a first analog signal 24 and the second digital signal 15 in a 1-bit digital-to-analog converter 13 into a second analog signal 25. By an analog shaping filter 21 and an amplifier 22, the second analog signal 25 is shaped, in that any jumps in the second analog signal 15 are smoothed, to achieve as good an (interference) suppression as possible in respect of the second analog signal 15 with the device 2.

Before the analog-converted, filtered and amplified second digital signal 15 is processed in the subtractor 28 to form a third analog signal 26, it passes through another control filter 6, as the analog-converted first digital signal 14 also passes through a control filter 6. Whereas in the first embodiment the analog-converted digital output signal 20 passes through the analog control filter 6, in the second embodiment both the analog-converted first digital signal 14 and the analog-converted second digital signal 15 in each case pass through an analog control filter 6 separately, these two control filters having the same transmission function.

So that the second analog signal 25 added at the subtractor 28 corresponds to a feedback of the second digital signal 15, the functions of the analog shaping filter 21 and the analog amplifier 22 are copied by means of a digital shaping filter 11 and an amplifier 12. With the digital shaping filter 11 and the amplifier 12, an analog shaping of the second analog signal or the interference is copied digitally in respect of the second digital signal 15, so the second analog signal in front of the control filter 6 corresponds as far as possible to the analog-converted second digital signal 15 in front of the addition element 27.

The second embodiment thus operates in principle like the first embodiment, but has the advantage that, instead of a 2-bit digital-to-analog converter 8, it requires only a 1-bit digital-to-analog converter 13, which has a far simpler construction than a 2-bit digital-to-analog converter 8. A further advantage compared with the first embodiment is that the device 2 illustrated in FIG. 2 has additional shaping filters 11, 21 and amplifiers 12, 22, whereby the second digital signal 15 can be better regulated. These shaping filters 11, 21 and amplifiers 12, 22 can, however, be omitted, depending on application, for example if the second digital signal comparatively rarely adopts a value unequal to 0.

In summary, the second digital signal 15 acts like an additional input variable of the single-bit sigma-delta converter, which, analog-converted, reduces the signal level of the input signal into the quantizer 7, whereby internal status variables inside the single-bit sigma-delta converter are also driven less, leading to a smaller dissipated power in comparison to a single-bit sigma-delta converter without feed of the analog-converted second digital signal 15.

If the device 2 is implemented in the switched capacitor technique, the entire path for generating and shaping the second digital signal 15 can, moreover, advantageously be lower clocked, thus again reducing the dissipated power.

In the second embodiment the second digital signal is formed not from the analog input signal but from the digital output signal, which in a certain form contains the analog input signal, as it is formed starting from the analog input signal. Similarly to the formation of the second digital signal from the analog input signal, the second digital signal is formed from the digital output signal with the aid of a comparator, in this case digital, in that a first digital value is generated for the second digital signal if a digital value of the digital output signal is above a first digital threshold value, in that a second digital value is generated for the second digital signal if the digital value of the digital output signal is below a second threshold value and in that otherwise a 0 is generated as digital value for the second digital signal. The first digital threshold value is in this case greater than the second digital threshold value and the first digital value is greater than 0 by the same amount by which the second digital value is smaller than 0.

The second digital signal is processed in particular before, after analog conversion, it is combined with the analog input signal in such a way that a signal course of the second digital signal is more smoothed or smoother (i.e. has fewer jumps) after processing, or, put another way, on average a first derivation of the signal course has smaller values than before processing. Regulation of the second digital signal, which can be interpreted as a kind of interference, is optimized by the smoothing of the second digital signal.

Figure 3:
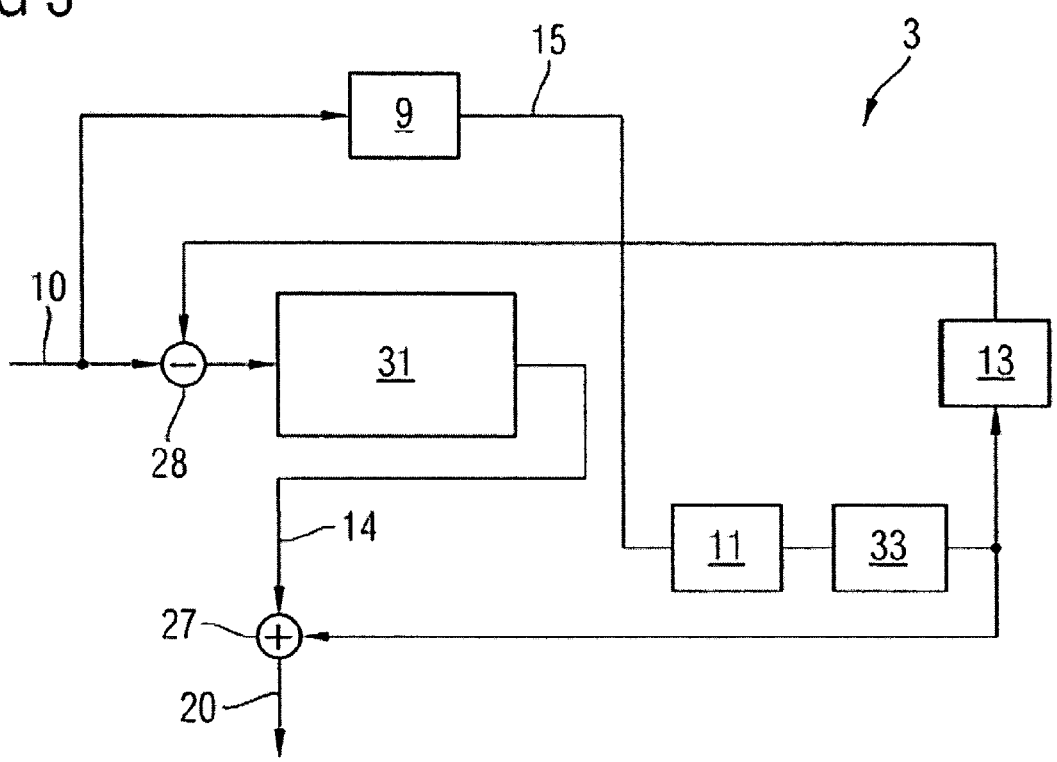
FIG. 3 illustrates a third example analog-to-digital converter, wherein an analog and a digital path are combined into one digital path.

In FIG. 3 a third embodiment of a device 3 for analog-to-digital conversion is illustrated. Again, elements which have the same function as in the first two embodiments are designated by the same reference numeral and their mode of functioning is not explained again.

In the third embodiment, the processed second digital signal 15, which has previously been converted in the 1-bit digital-to-analog converter 13, is subtracted from the analog input signal 10 and fed to a multi-bit sigma-delta converter 31, which generates the first digital signal 14. The second digital signal 15 is processed by a digital shaping filter 11 and a noise shaper 33, switched downstream. The noise shaper 33 reduces a word width of the second digital signal 15 at the output of the digital shaping filter 11 to a word width of 1. The digital values of the second digital signal 15 at the output of the noise shaper 33 have only the values 0 and 1, although digital values applied to the input of the noise shaper 33 have values which are greater than 1. It is possible to operate with the 1-bit digital-to-analog converter 13 instead of a multi-bit digital-to-analog converter to convert the second digital signal 15 into an analog signal. To generate the digital output signal 20, the first digital signal 14 is added to the processed second digital signal 15 in an addition element 27.

Figure 4:
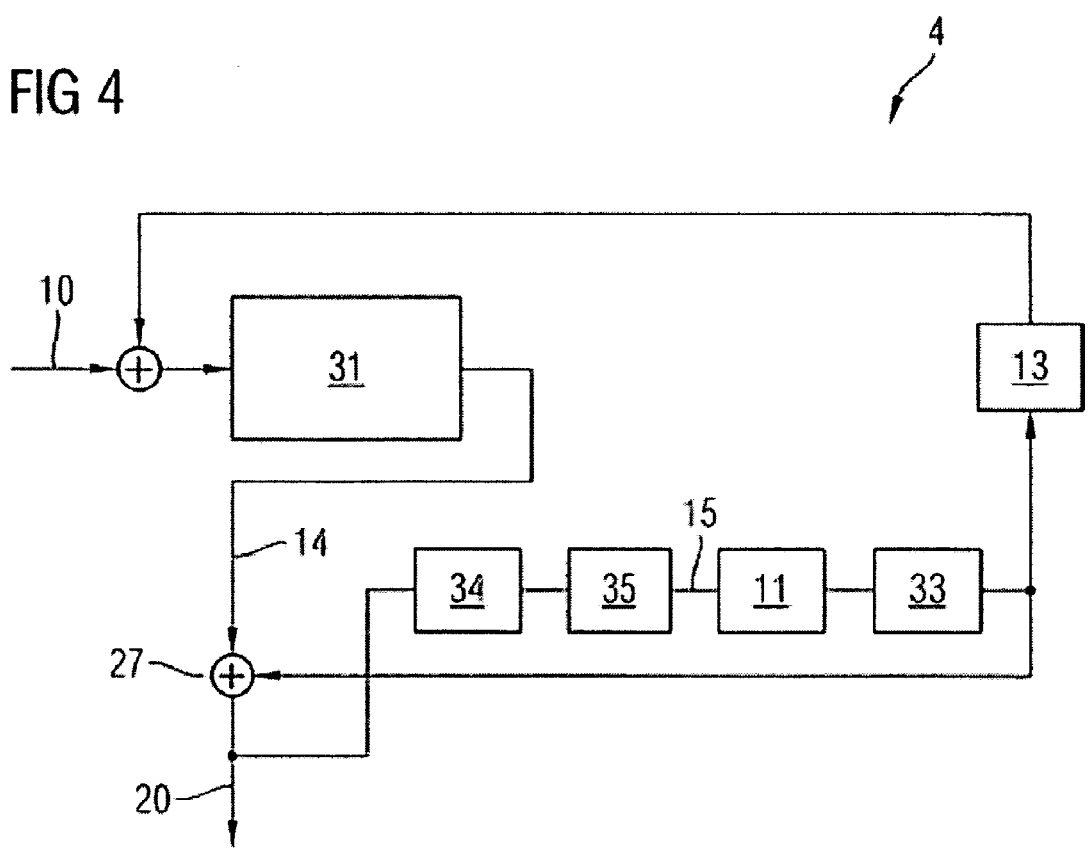
FIG. 4 illustrates a fourth example analog-to-digital converter, where a digital signal is generated depending on a digital output signal.

In FIG. 4 a fourth embodiment of a device 4 for analog-to-digital conversion is illustrated. By comparison with the third embodiment, in the fourth embodiment only the way in which the unprocessed second digital signal 15 is generated is different. Whereas the unprocessed second digital signal 15 in the third embodiment is determined from the analog input signal 10 by the 3-value comparator operating as analog, the unprocessed second digital signal 15 in the fourth embodiment is determined by a digital threshold value detector 34 and a digitally operating 3-value comparator 35.

In a comparison of the second embodiment, illustrated in FIG. 1, and the third and fourth embodiments, illustrated in FIGS. 3 and 4, the following differences are shown. Neither the third nor the fourth embodiment requires an analog shaping filter 21 or an analog amplifier 22, wherein the fourth embodiment additionally likewise does not require an analog-operating 3-value comparator.

In the second embodiment the digital shaping filter 11 and the digital amplifier 12 must match the analog shaping filter 21 and the analog amplifier 22 exactly for the device 2 to operate correctly. A demand with respect to matching requires an additional surface requirement in an implementation as a semiconductor circuit, as it applies as a rule of thumb that matching is inversely proportional to the root of the dimensions of a corresponding device for which matching is to be achieved. Matching is all the more difficult to achieve or to guarantee, the smaller the dimensions of the corresponding device are. Moreover, any intrinsic noise in the analog shaping filter 21 and the analog amplifier 22 must be kept low, so that an overall power performance of the device 2 is not restricted. The outlay on circuit technology and the dissipated power in the device 3 and 4 of the third or fourth embodiment are less than in device 2 according to the second embodiment. The omission of the analog-operating devices (shaping filter 21, amplifier 22, 3-value comparator 9) thus results in a considerably smaller surface requirement if the device 3, 4 is implemented as a semiconductor circuit.

The fact that the second digital signal 15 in the third and fourth embodiments is derived from the digital output signal, which has been low-pass filtered in the third and fourth embodiments inside the multi-bit sigma-delta converter 31, whereas the second digital signal 15 in the second (and also the first) embodiment is derived from the non-low-pass filtered analog input signal 10, has no negative effects, as the therewith associated time delay owing to a sufficiently high oversampling of the sigma-delta converter is insignificant. Overall the device 3, 4 of the third and fourth embodiments is extremely robust in comparison to device 2 of the second embodiment, as, because of the digital solution (no analog shaping filter 21 and no analog amplifier 22), a disadvantageous mismatch of a path consisting in FIG. 2 of blocks 11 and 12 with a path consisting in FIG. 2 of blocks 13, 21, 22 and 6 cannot even occur. Moreover, the digital shaping filter 11 can be configured as highly flexible compared with the analog shaping filter 21, whereby the drive area of the sigma-delta converter 31 can be considerably increased in comparison to the second embodiment.

Figure 5:
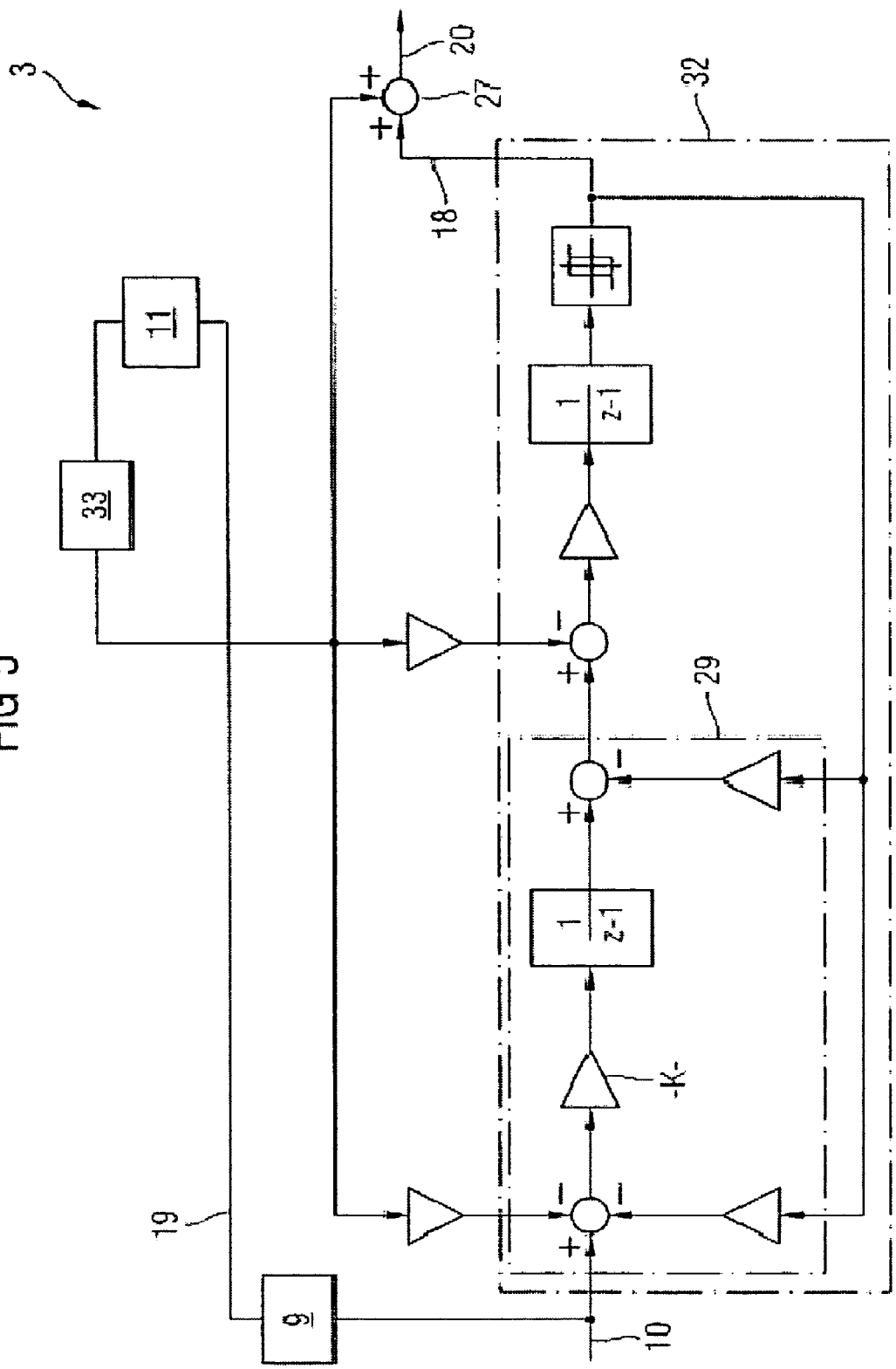
FIG. 5 illustrates an example single-bit sigma-delta converter.

In FIGS. 5 and 6 a fifth and a sixth embodiment are illustrated. The fifth embodiment here substantially corresponds to the third embodiment and the sixth embodiment to the fourth embodiment. The difference between the third and fourth embodiments and the fifth and sixth embodiments is on the one hand that the multi-bit sigma-delta converter 31 is replaced in the fifth and sixth embodiments by a single-bit sigma-delta converter 32 and on the other hand in the form of the feeding of the processed second digital signal 15 into the single-bit sigma-delta converter 32. Moreover, in the illustration of the device 3, 4 a digital-to-analog converter necessary for feeding the second digital signal 15 into the single-bit sigma-delta converter 32 is not explicitly illustrated. In a variant according to the invention, not illustrated, of the device 3, 4, configured in the switched capacitor technique or in the current steering technique or as time continuous, this necessary digital-to-analog converter can be implemented with a low circuit outlay.

The switched capacitor technique is understood as a technique in which the device 3, 4 is configured with capacitors, which are switchable via a switch, switched at the respective sampling rate. On the other hand, the device 3, 4 is constructed in the current steering technique of several current cells, each of which possesses a current mirror and a current switch. Analog signals are accordingly illustrated in the switched capacitor technique in the form of a charge variable and in the current steering technique in the form of a current variable.

For a specific time or a specific sampling it may occur that the analog signal combined from the analog-converted processed second digital signal and the analog input signal has an amplitude value which is greater than a reference voltage of the single-bit sigma-delta converter 32, which could have a considerable effect, owing to the rough quantising with the single-bit sigma-delta converter. However, with device 5 or 6 this is no problem; as a function block 29 of the single-bit sigma-delta converter 32 represents a low pass or an integrator and the second digital signal 15 has a large power proportion specifically in the high frequency range, so overdrive of the single-bit sigma-delta converter 32 is ruled out.

In application areas in which only a small or moderate increase in the dynamic range of the single-bit sigma-delta converter 32 is required, the digital shaping filter 11 and the noise shaper 33 can be omitted, as in this case a qualitatively less powerful suppression of the second digital signal 15 is sufficient.

The analog-to-digital converter device is preferably suitable for use in oversampled, fed back analog-to-digital converters, known in particular as sigma-delta analog-to-digital converters, so that these analog-to-digital converters can be operated without restriction of their drive, specifically if it is a single-bit sigma-delta analog-to-digital converter. Sigma-delta converters are used, for example, in voice coding. However, the present invention is not of course confined to this preferred area of application, but can also be used as a peak compensator (compensator of a few increased amplitude values), for example in DMT systems (discrete multi-frequency systems) with a high crest factor (crest factor=maximum value/effective value), wherein the converter system can be used for compensating clipping effects (owing to the cutting off of occurring effects).

It is therefore intended that the foregoing detailed description be regarded as illustrative rather than limiting, and that it be understood that it is the following claims, including all equivalents, that are intended to define the spirit and scope of this invention.

The invention claimed is:

1. A method for analog-to-digital conversion, comprising:
converting an analog input signal into a digital output signal, wherein said converting comprises:
converting the analog input signal into a first digital signal by a fed back analog-to-digital conversion,
forming the digital output signal from a combination of the first digital signal and a second digital signal, and
forming the second digital signal based on the analog input signal;
forming an analog signal from a difference of the analog input signal and the digital output signal;
converting the analog signal into the first digital signal; and
forming the digital output signal from an addition of the first digital signal and the second digital signal.

2. The method according to claim 1, wherein converting the analog input signal comprises converting the analog input signal by an oversampled fed back analog-to-digital conversion.

3. The method according to claim 1, further comprising analog-converting the digital output signal to form the difference.

4. The method according to claim 3, further comprising filtering the analog input signal and the analog-converted digital output signal before forming the difference.

5. The method according to claim 1, further comprising low-pass filtering the analog input signal before forming the difference.

6. The method according to claim 1, further comprising forming the second digital signal from the analog input signal, wherein a first digital value is formed if the analog input signal is above a first threshold value, a second digital value is formed if the analog input signal is below a second threshold value and otherwise a third digital value is formed, and wherein the first threshold value is greater than the second threshold value.

7. A method for analog-to-digital conversion, comprising:
converting an analog input signal into a digital output signal, wherein said converting comprises:
converting the analog input signal into a first digital signal by a fed back analog-to-digital conversion,
forming the digital output signal from a combination of the first digital signal and a second digital signal, and
forming the second digital signal based on the analog input signal;
forming a third analog signal from a difference of the analog input signal and a sum of a first analog signal, which is formed from a digital-to-analog conversion of the first digital signal, and a second analog signal, which is formed from a digital-to-analog conversion of the second digital signal;
converting the third analog signal into the first digital signal; and
forming the digital output signal from an addition of the first digital signal and the second digital signal.

8. The method according to claim 7, further comprising smoothing the second analog signal before forming the difference.

9. The method according to claim 8, further comprising processing the second digital signal such that an analog-converted second digital signal corresponds to the smoothed second analog signal.

10. The method according to claim 7, further comprising low-pass filtering the analog input signal before forming the difference.

11. The method according to claim 7, further comprising filtering the first analog signal and the second analog signal with an identical filtering function before forming the difference.

12. The method according to claim 1, further comprising:
feeding the analog input signal and the second digital signal to a sigma-delta converter to form the first digital signal; and
forming the second digital signal depending on the analog input signal.

13. The method according to claim 12, further comprising forming the second digital signal from the analog input signal, wherein a first digital value is formed if the analog input signal is above a first threshold value, a second digital value is formed if the analog input signal is below a second threshold value and otherwise a third digital value is formed, wherein the first threshold value is greater than the second threshold value, and wherein the first digital value is greater than 0 by an amount by which the second digital value is smaller than 0.

14. A method for analog-to-digital conversion, comprising: converting an analog input signal into a digital output signal; wherein said converting comprises: forming a first digital signal by feeding a sum of the analog input signal and a second digital signal which is analog-converted to a sigma-delta converter; forming the second digital signal by processing the digital output signal; and forming the digital output signal from a combination of the first digital signal and the second digital signal.

15. The method according to claim 14, further comprising forming the second digital signal from the digital output signal, wherein a first digital value is formed if a digital value of the digital output signal is above a first threshold value, a second digital value is formed if the digital value of the digital output signal is below a second threshold value and otherwise a third digital value is formed, wherein the first threshold value is greater than the second threshold value and wherein the first digital value is greater than 0 by an amount by which the second digital value is smaller than 0.

16. The method according to claim 14, further comprising processing the second digital signal, before the second digital signal is subtracted and analog-converted, from the analog input signal, such that a difference between two digital values of the processed second digital signal, which are a given period of time apart, is on average smaller than a difference between two digital values of the second digital signal without processing, which are the given period of time apart.

17. The method according to claim 16, further comprising converting the processed second digital signal, before the second digital signal is combined with the first digital signal, such that its digital values represent one bit.

18. The method according to claim 17, further comprising converting the processed and converted second digital signal into an analog signal by a 1-bit analog-to-digital converter, before the processed and converted second digital signal is fed to the sigma-delta converter.

19. The method according to claim 14, wherein the sigma-delta converter comprises a 1-bit sigma-delta converter, that on an output side generates only digital values representing one bit.

20. A device for analog-to-digital conversion, comprising:
a fed back analog-to-digital converter;
a combination unit operable to combine the first digital signal and a second digital signal to generate the digital output signal, wherein the device is operable to convert an analog input signal into a digital output signal, wherein the fed back analog-to-digital converter is operable to convert the analog input signal of the device into a first digital signal, wherein the device is operable to form the second digital signal based on the analog input signal; and
a subtraction unit operable to form an analog signal from a difference of the analog input signal and the digital output signal, and a quantizer unit, wherein the quantizer unit is operable to determine the first digital signal from the analog signal, and wherein the combination unit is operable to determine the digital output signal by an addition of the first digital signal and the second digital signal.

21. The device according to claim 20, wherein the fed back analog-to-digital converter comprises an oversampled fed back analog-to-digital converter.

22. The device according to claim 20, further comprising a 2-bit digital-to-analog converter operable to analog-convert the digital output signal before the subtraction unit forms the difference.

23. The device according to claim 22, further comprising a filter operable to filter the analog-converted digital output signal, before the subtraction unit forms the difference.

24. The device according to claim 22, further comprising a low-pass filter operable to filter the analog input signal, before the subtraction unit forms the difference.

25. A device for analog-to-digital conversion, comprising:
a fed back analog-to-digital converter;
a combination unit operable to combine the first digital signal and a second digital signal to generate the digital output signal, wherein the device is operable to convert an analog input signal into a digital output signal, wherein the fed back analog-to-digital converter is operable to convert the analog input signal of the device into a first digital signal, wherein the device is operable to form the second digital signal based on the analog input signal; and
a comparator, and wherein the comparator is operable to generate the second digital signal, wherein the comparator supplies a first digital value on the output side if the analog input signal is above a first threshold value, supplies a second digital value if the analog input signal is below a second threshold value and otherwise supplies a third digital value and wherein the first threshold value is greater than the second threshold value.

26. A device for analog-to-digital conversion, comprising a first 1-bit digital-to-analog converter and a second 1-bit digital-to-analog converter, a subtraction unit, a quantizer, and a combination unit, wherein the device is operable to convert an analog input signal into a first digital signal and a digital output signal; wherein the device is operable to form a second digital signal depending on the analog input signal; wherein the first 1-bit digital-to-analog converter is operable to generate a first analog signal from the first digital signal; wherein the second 1-bit digital-to-analog converter is operable to generate a second analog signal from the second digital signal; wherein the subtraction unit is operable to generate a third analog signal from a difference of the analog input signal and a sum of the first analog signal and the second analog signal; wherein the quantizer is operable to generate the first digital signal from the third analog signal; and wherein the combination unit is operable to generate the digital output signal from the first digital signal and the second digital signal.

27. The device according to claim 26, further comprising an analog shaping filter operable to smooth the second analog signal.

28. The device according to claim 27, further comprising a digital shaping filter operable to process the second digital signal such that an analog-converted second digital signal corresponds to the smoothed second analog signal after processing.

29. The device according to claim 26, further comprising a first analog filter and a second analog filter, and wherein the first analog filter is operable to filter the first analog signal with a filtering function identical to the way in which the second analog filter filters the second analog signal, before the subtraction unit forms the difference.

30. The device according to claim 26, further comprising a low-pass filter operable to filter the analog input signal, before the subtraction unit forms the difference.

31. The device according to claim 26, further comprising a sigma-delta converter, wherein the analog input signal and the second digital signal are fed to the sigma-delta converter; wherein the sigma-delta converter is operable to generate the first digital signal; and wherein the device is operable to generate the second digital signal based on the analog input signal.

32. The device according to claim 31, further comprising a comparator, wherein the analog input signal is fed to the comparator; wherein the comparator supplies a first digital value on an output side if the analog input signal is above a first threshold value, supplies a second digital value if the analog input signal is below a second threshold value and otherwise supplies a third digital value, wherein the first threshold value is greater than the second threshold value, and wherein the first digital value is greater than 0 by an amount by which the second digital value is smaller than 0.

33. A device for analog-to-digital conversion, comprising a sigma-delta converter, a combination unit, and a digital-to-analog-converter, wherein the device is operable to convert an analog input signal into a digital output signal; wherein the sigma-delta converter is operable to generate a first digital signal from a sum of the analog input signal and an analog signal; wherein the device is operable to generate a second output signal based on the digital output signal; wherein the digital-to-analog-converter is operable to convert the second digital signal into the analog signal; and wherein the combination unit is operable to combine the first digital signal and the second digital signal to generate the digital output signal.

34. The device according to claim 33, further comprising a digital threshold value detector and a comparator; wherein the digital threshold value detector is charged with the digital output signal and an output of the digital threshold detector is connected to an input of the comparator; wherein the comparator is operable to supply a first digital value on an output side if a digital value of the digital output signal is above a first threshold value, supply a second digital value if the digital value of the digital output signal is below a second threshold value and otherwise supply a third digital value; wherein the first threshold value is greater than the second threshold value; and wherein the first digital value is greater than 0 by an amount by which the second digital value is smaller than 0.

35. The device according to claim 33, further comprising a digital shaping filter, wherein the second digital signal is supplied to the digital shaping filter, before the second digital signal is fed to the subtraction unit, wherein the second digital signal is processed by the digital shaping filter such that a difference between two digital values of the processed second digital signal, which are a given period of time apart, is on average smaller than a difference between two digital values of the second digital signal without processing, which are the given period of time apart.

36. The device according to claim 35, further comprising a noise shaper, wherein an output of the digital shaping filter is connected to an input of the noise shaper; wherein the noise shaper is operable to convert the second digital signal such that its digital values comprise approximately one bit.

37. The device according to claim 33, further comprising a 1-bit digital-to-analog converter, wherein an output of the noise shaper is connected to an input of the 1-bit digital-to-analog converter; and wherein a signal at an output of the 1-bit digital-to-analog converter is fed to the sigma-delta converter.

38. The device according to claim 33, wherein the sigma-delta converter comprises a 1-bit sigma-delta converter.

39. The device according to claim 33, wherein the device comprises a switched capacitor-style device or a current steering-style device.

40. A device for analog-to-digital conversion, comprising a first 1-bit digital-to-analog converter and a second 1-bit digital-to-analog converter, a subtractor, a quantizer, a 3-value comparator, and an adder, wherein an input of the device is connected to an input of the 3-value comparator and a first input of the subtractor; wherein an output of the 3-value comparator is connected to a first input of the adder and an input of the first 1-bit digital-to-analog converter; wherein an output of the first 1-bit digital-to-analog converter is connected to a second input of the subtractor; wherein an output of the subtractor is connected to an input of the quantizer; wherein an output of the quantizer is connected to a second input of the adder and an input of the second 1-bit digital-to-analog converter; wherein an output of the second 1-bit digital-to-analog converter is connected to a third input of the subtractor; wherein the subtractor is operable to generate a value of its output from a difference of a value of its first input and a sum of a value of its second input and a value of its third input; and wherein an output of the adder is an output digital signal of the device.

41. A device for analog-to-digital conversion, comprising a sigma-delta converter, a digital threshold value detector, a 3-value comparator, a first adder, a second adder and a 1-bit digital-to-analog-converter, wherein an input of the device is connected to a first input of the first adder; wherein an output of the first adder is connected to an input of the sigma-delta converter; wherein an output of the sigma-delta converter is connected to a first input of the second adder; wherein an output of the second adder is an output of the device and is connected to an input of the digital threshold value detector; wherein an output of the digital threshold value detector is connected to an input of the 3-value comparator; wherein an output of the 3-value comparator is connected to a second input of the second adder and an input of the 1-bit digital-to-analog-converter; and wherein an output of the 1-bit digital-to-analog-converter is connected to a second input of the first adder.

42. An apparatus for analog-to-digital conversion, comprising: means for converting an analog input signal into a digital output signal; wherein said means for converting comprises: means for forming a first digital signal by feeding a sum of the analog input signal and a second digital signal which is analog-converted to a sigma-delta converter; means for forming the second digital signal by processing the digital output signal; and means for forming the digital output signal from a combination of the first digital signal and the second digital signal.

43. A device for analog-to-digital conversion, comprising a first and a second 1-bit digital-to-analog converter, subtraction means, a quantizer and combination means, wherein the device is operable to convert an analog input signal into a first digital signal and a digital output signal; wherein the device is operable to form a second digital signal depending on the analog input signal; wherein the first 1-bit digital-to-analog converter is operable to generate a first analog signal from the first digital signal; wherein the second 1-bit digital-to-analog converter is operable to generate a second analog signal from the second digital signal; wherein the subtraction means generates a third analog signal from a difference of the analog input signal and a sum of the first analog signal and the second analog signal; wherein the quantizer is operable to generate the first digital signal from the third analog signal; and wherein the combination means generates the digital output signal from the first digital signal and the second digital signal.

* * * * *

UNITED STATES PATENT AND TRADEMARK OFFICE
CERTIFICATE OF CORRECTION

PATENT NO. : 7,333,041 B2  
APPLICATION NO. : 11/471458  
DATED : February 19, 2008  
INVENTOR(S) : Richard Gaggl et al.

It is certified that error appears in the above-identified patent and that said Letters Patent is hereby corrected as shown below:

On the Title Page

In column 1, item (75), after "Dietmar" delete "Straussnigg" and substitute --Sträussnigg-- in its place.

Signed and Sealed this

First Day of July, 2008

JON W. DUDAS  
*Director of the United States Patent and Trademark Office*